(12) United States Patent
Lee et al.

(10) Patent No.: US 11,568,904 B1
(45) Date of Patent: Jan. 31, 2023

(54) MEMORY WITH POSITIVELY BOOSTED WRITE MULTIPLEXER

(71) Applicant: QUALCOMM Incorporated, San Diego, CA (US)

(72) Inventors: Hochul Lee, Los Angeles, CA (US); Anil Chowdary Kota, San Diego, CA (US); Dhvani Sheth, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/451,110

(22) Filed: Oct. 15, 2021

(51) Int. Cl.
*G11C 7/10* (2006.01)
*G11C 7/12* (2006.01)
*G11C 5/14* (2006.01)

(52) U.S. Cl.
CPC .............. *G11C 7/1012* (2013.01); *G11C 5/14* (2013.01); *G11C 7/1069* (2013.01); *G11C 7/1096* (2013.01); *G11C 7/12* (2013.01)

(58) Field of Classification Search
CPC ........ G11C 7/1012; G11C 5/14; G11C 7/1069; G11C 7/1096; G11C 7/12
USPC ....................................................... 365/189.02
See application file for complete search history.

(56) References Cited

U.S. PATENT DOCUMENTS

| | | | |
|---|---|---|---|
| 8,593,890 B2 | 11/2013 | Adams et al. | |
| 9,208,900 B2 | 12/2015 | Sinangil et al. | |
| 9,837,144 B1 | 12/2017 | Sinha et al. | |
| 9,842,634 B2 | 12/2017 | Jeong et al. | |
| 9,865,337 B1 | 1/2018 | Ahmed et al. | |
| 9,875,790 B1* | 1/2018 | Sinha | G11C 11/419 |

* cited by examiner

*Primary Examiner* — Huan Hoang
(74) *Attorney, Agent, or Firm* — Haynes and Boone, LLP

(57) ABSTRACT

A memory is provided that includes a write multiplexer, which multiplexes among a plurality of bit line columns. The multiplexer includes a positive boost circuit that applies a positive boost to a voltage at the gates of transistors to strengthen an on state of those transistors. The positive boosting may be in addition to, or instead of, negative boosting at a write driver circuit.

25 Claims, 9 Drawing Sheets

| Case | Feature | Noise Margin [mV] | | | |
|---|---|---|---|---|---|
| | | Mean | Sigma | Mean/Sigma | Mean-6.5 Sigma |
| Case 1 | NBL on | 182.90 | 23.02 | 7.95 | 33.27 |
| Case 2 | NBL on & NBL ACC on | 206.70 | 20.39 | 10.14 | 74.16 |
| Case 3 | NBL on & wm boost | 221.20 | 17.48 | 12.65 | 107.58 |

MEMORY WITH POSITIVELY BOOSTED WRITE MULTIPLEXER

TECHNICAL FIELD

This application relates to memories, and more particularly to single- or multi-bank memories with positively boosted write multiplexer.

BACKGROUND

In a conventional static random-access memory (SRAM), a bitcell connects to a pair of bit lines. Prior to a write operation, the bit lines are pre-charged to the power supply voltage used for the bitcell. Depending upon the data to be written to the bitcell, a write multiplexer may discharge either the true bit line or the complement bit line in the bit line pair from its pre-charged state.

There is a need in the art for memories having increased write margin and less leakage.

SUMMARY

In one implementation, a circuit includes a first bit line coupled to a first write driver output by a first n-type metal oxide semiconductor (NMOS) transistor; a first complementary bit line coupled to a second write driver output by a second NMOS transistor; a first inverter having an output coupled to a first gate of the first NMOS transistor and a second gate of the second NMOS transistor; and a first boost circuit coupled to a power node of the first inverter, the first boost circuit including a first transistor coupling a power supply to the power node of the first inverter and also including a first capacitor coupled to the power node of the first inverter and to the first transistor.

In another implementation, a method for performing a write operation in a memory system, the method includes: receiving a write multiplexing signal at a first column within a write multiplexer, wherein the first column includes a bit line and a complementary bit line in communication with a memory bank; generating a boosted write multiplexing signal from the write multiplexing signal; applying the boosted write multiplexing signal to a first control terminal of a first transistor and to a second control terminal of a second transistor, wherein the first transistor couples a first write driver output to the bit line and the second transistor couples a second write driver output to the complementary bit line; and writing a data value into a memory cell in the memory bank, wherein the data value is defined by the first write driver output and the second write driver output In another implementation, a memory includes a first multiplexer coupling a first plurality of bit lines to a write driver; a second multiplexer coupling a second plurality of bit lines to the write driver; and a first boost circuit coupled to a first plurality of column inverters associated with the first multiplexer and coupled to a second plurality of column inverters associated with the second multiplexer; the first boost circuit including a first transistor coupling a power supply to power nodes of the first plurality of column inverters and of the second plurality of column inverters, the first boost circuit further including a first capacitor coupled to the power nodes and to the first transistor.

In yet another implementation, a circuit includes a plurality of columns, each one of the columns including a bit line and a complementary bit line in communication with a respective memory bit cell; means for multiplexing signals from a write driver to the plurality of columns, the multiplexing means including a plurality of transistors coupling respective bit lines and respective complementary bit lines to the write driver; and means for positively boosting a voltage applied to gates of the plurality of transistors of the multiplexing means.

These and additional advantages may be better appreciated through the following detailed description.

BRIEF DESCRIPTION OF THE DRAWINGS

FIG. 7 illustrates a table showing test results associated with a simulation of the memory of FIG. 1.

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
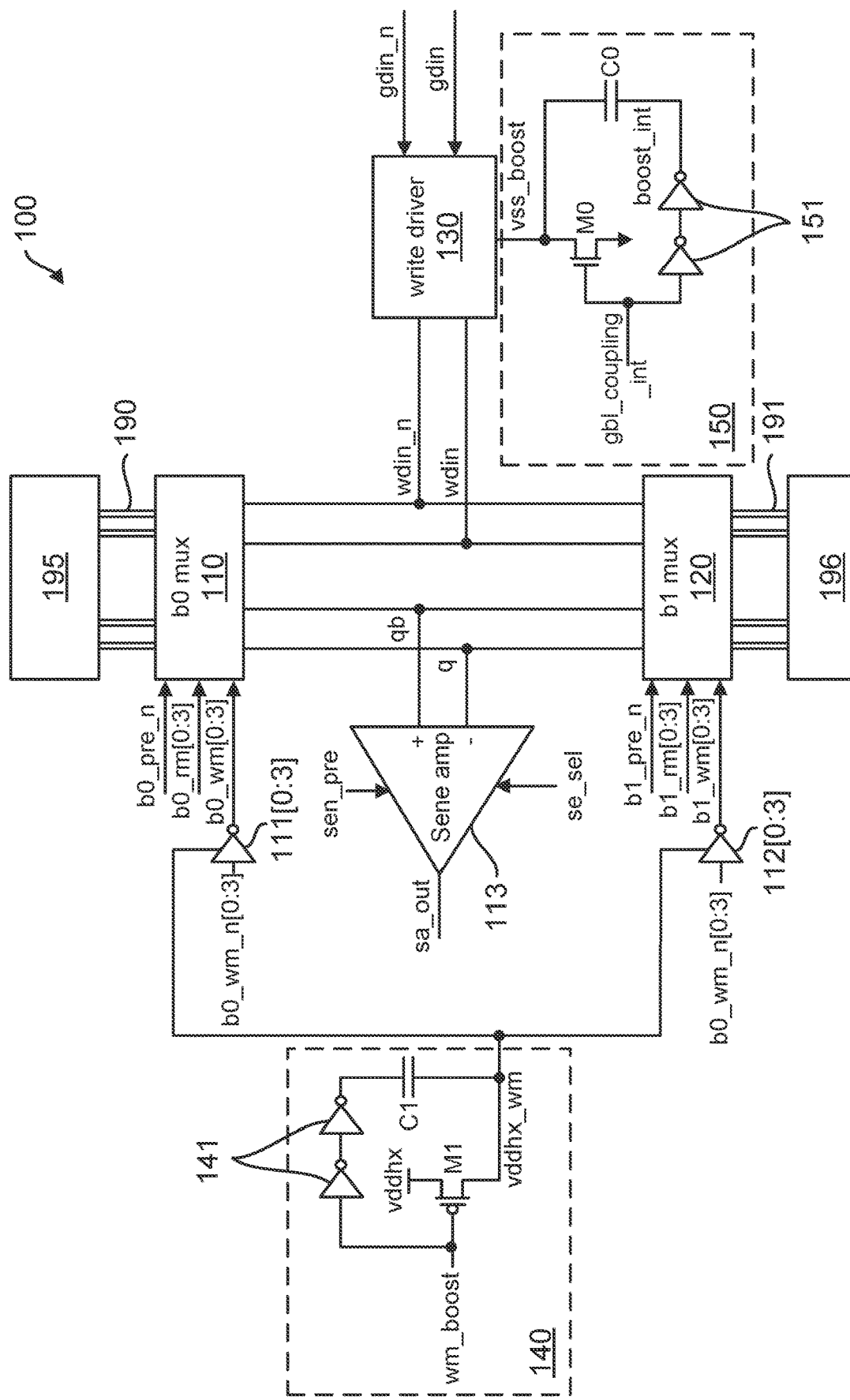
FIG. 1 illustrates a multi-bank memory with positive boosting and negative boosting, according to one implementation.

An example write operation includes negative boosting at a write driver so that the binary data includes a binary zero that is pulled lower by the negative boosting. The purpose is to pull either the bit line or the complement bit line lower than it would go otherwise to increase write margin. In other words, the negative boosting makes a difference between the bit line and the complement bit line larger than it would otherwise be, thereby decreasing the chances of a failed write operation.

However, a write operation with negative boost may cause a gate-source voltage of an n-type metal oxide semiconductor (NMOS) transistor within the write driver to experience leakage. Leakage may be undesirable, as it may result in excess power use over multiple write operations by multiple write drivers.

Accordingly, a memory such as an SRAM is provided in which a write multiplexer includes a positive boosting circuit. The positive boosting may increase a gate-source voltage of an NMOS transistor that couples a bit line to a data input. The boost voltage applied to the gate of the NMOS transistor may then discharge a bit line that is coupled through the NMOS transistor to the binary 0 data bit. In fact, the boosted voltage may increase the speed of discharging the bit line. The complementary bit line is coupled to the binary 1 data bit through another NMOS transistor that also receives the boosted gate voltage. The NMOS transistor has a relatively strong on state, which transfers some charge from the data input to the complementary bit line. The result is that a voltage difference between the bit line and the complementary bit line is larger than it would be otherwise.

An example circuit may include a first bit line that is coupled to a first write driver output by a first NMOS transistor. A first complementary bit line is coupled to a second write driver output (e.g., the complementary write driver output) by a second NMOS transistor. The bit line and the complementary bit line are part of a column, and a column inverter is coupled by its output to the gates of the first and second NMOS transistors. A boost circuit is coupled to a power node of the first inverter. The first boost circuit may include a first transistor coupling a power supply to the power node of the first inverter as well as a first capacitor that is coupled to the power node of the first inverter and to the first transistor. During a boost operation, the first capacitor discharges charge and then accumulates some of that charge to provide a boosted voltage to the power node of the first inverter. When the column is selected, a multiplexing signal causes the output of that column inverter to be a digital 1, which is boosted by the boost circuit and applied to the gates of the NMOS transistors. The NMOS transistors then either charge or discharge, as appropriate, their respective bit lines according to the data to be written.

The boost circuit may be coupled to a single memory bank or to multiple memory banks. Furthermore, the positive boost from the boost circuit may be applied to the write multiplexing signal, and some implementations may further include a negative boost applied by a write driver of the memory circuit. The negative boost at the write driver may provide even greater difference between the voltages of the bit lines in the column during a write operation.

As noted above, sometimes negative boosting may result in leakage. However, various implementations may limit an amount of negative boost to a magnitude that is small enough to result in negligible (or no) leakage. Thus, rather than increasing a magnitude of the negative boost, various implementations herein either replace the negative write driver boost with positive boost at the multiplexer or supplement the negative write driver boost with the positive boost at the multiplexer. As a result, some implementations may achieve a greater write margin while at the same time limiting an amount of leakage incurred at the write driver.

FIG. 1 is an illustration of a memory system 100, according to one implementation. Memory system 100 is a multi-bank memory system, in this case using two memory banks, namely, bank b0 195, and bank b1 196. As one of skilled would appreciate, the positive boosting technique disclosed herein can be applied to multi-bank memory system having any number of memory banks, not limited to two-bank memory. Each of the memory banks 195, 196 includes multiple columns of bit cells, each column having a bit line and complementary bit line, and each of the memory banks traversed by multiple word lines. Bit lines and complementary bit lines 190, 191 are illustrated as each having four pairs, and it is understood that a given memory bank may include any appropriate number of bit line pairs corresponding to any appropriate number of columns.

Looking at multiplexer 110, it corresponds to bank b0 195, and it multiplexes the bit line pairs 190 onto the data inputs wdin, wdin_n as well as sense nodes q_b0 and qb_b0. Similarly, multiplexer 120 corresponds to bank b1 196, and it multiplexes the bit line pairs 191 onto the data inputs wdin, wdin_n as well as the sense nodes q_b1, qb_b1. In this example, each of the multiplexers 110, 120 receives three signals, including pre_n (bit line pre-charging), rm [0:3] (a read multiplexing signal), and wm [0:3] (a write multiplexing signal). It is noted here that the signals rm and wm are shown as selecting among four columns, and as noted above, the scope of implementations supports any number of columns that may be multiplexed.

The sense node and complementary sense node are inputs to the sense amplifier 113. Further in this example, memory system 100 performs either a read or a write operation on one of the memory banks 195, 196 at a given time and does not perform operations simultaneously on both memory banks 195, 196. Sense amplifier 113 bases a bit decision upon a difference in voltage between a given sense node pair corresponding to one of the memory banks 195, 196 in response to a read operation on that respective bank.

Write operations may include receiving differential data on gdin, gdin_n from a data source (not shown). The write driver 130 conforms a voltage level of the differential data to a level compatible with writing to the memory banks 195, 196. The voltage level shifted data wdin, wdin_n is an sent to multiplexers 110, 120. One of the multiplexers 110, 120 has a column that is selected by the signal wm to write the data to its respective memory bank 195, 196. For instance, with respect to multiplexer 110, there are four wm signals [0:3], and the three unselected columns correspond to a digital 0 value, and the one selected column corresponds to a digital 1 value. The same is true for multiplexer 120.

Implementations described herein apply a positively boosted voltage to a power node of the column inverters 111, 112, which results in a boosted voltage of the write multiplexing (wm) signals. The column inverters 111, 112 provide the wm signals to their respective multiplexers 110, 120.

Similarly, write driver 130 provides a negative boost to one of the differential data portions that is a digital 0. The positive boost of the write multiplexing signal and the negative boost of the data work together to increase the write margin experienced by the memory banks 195, 196. The boost circuits 140, 150 will now be described.

Consider an example in which gdin_n is 1 and gdin is 0. Circuit 151 makes vss_boost get as low as 0-Δv1 by using capacitor C0. Applying a 1 to the gate of transistor M0 brings down the voltage at the node vss_boost to ground. The 1 value of gbl_coupling int is applied to the series inverters 151 so that boost int is also 1. Then the transistor M0 is turned off, and that causes the boost int node to go from 1 to 0. This may allow for applying further negative voltage at the node vss_boost by using capacitive coupling.

Figure 2:
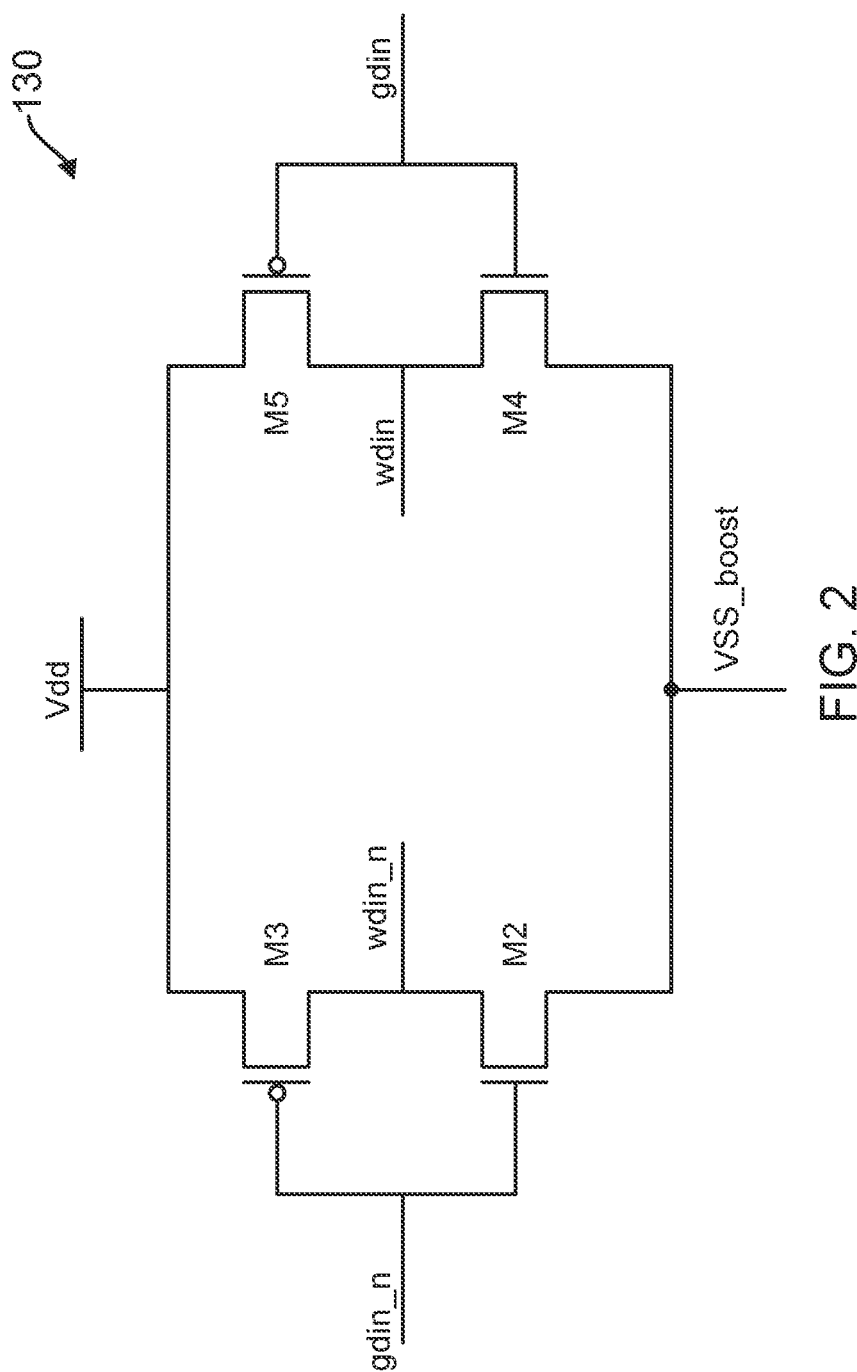
FIG. 2 illustrates an example write driver circuit in the memory of FIG. 1.

Operation of boost circuit 150 is further discussed with respect to FIG. 2. As noted above, in this example, gdin_n is 1 and gdin is 0. Transistor M5 is on, as is transistor M2, and transistors M3 and M4 are both off. Thus, wdin_n goes to vss_boost, whereas wdin goes to VDD. In an instance in which vss_boost is actually lower than Vss (e.g., ground), then the voltage level difference between the two data lines wdin, wdin_n is larger than VDD, which may be expected to lead to a higher write margin.

However, applying negative boost may lower the source voltage of the transistor M4, which may cause M4 to leak. Because of this leakage, it may become undesirable to lower the vss_boost more than a certain negative voltage level. In fact, increased leakage may not only cause undesirable power usage, but it may degrade write margin in some instances. Therefore, various implementations herein may use a size of capacitor C0 commensurate with a negative voltage boost that is not expected to result in an undesirable level of leakage. To the extent that write margin could be further improved, that improvement may come through techniques that do not increase the negative voltage boost, such as applying a positive voltage boost at the multiplexers 110, 120.

Going back to FIG. 1, boost circuit 140 applies a positive boost to the write multiplexing signals wm at both multiplexers 110, 120. The positive boost increases a voltage of the wm signal to vddhx plus a Δv2 by virtue of capacitor C1. In an example, wm_boost starts at 0, which turns on transistor M1 and applies vddhx to the bottom node of capacitor C1 and the power nodes of the inverters 111, 112. The 0 value of wm_boost is applied to the top node of capacitor C1 through the series inverters 141. When transistor M1 turns on, that causes the voltage of wm to increase in potential to vddhx. Then wm_boost goes to 1, and that applies a 1 to the top node of capacitor C1, which adds a positive boost to the voltage of vddhx_wm, which allows wm to reach positively boosted vddhx_wm. The positive boost (Δv2) may be any appropriate value, and in some instances, may be 50 to 100 mV. The size of the positive boost may be affected by selecting a capacitance for capacitor C1 commensurate with the desired Δv2.

Figure 3:
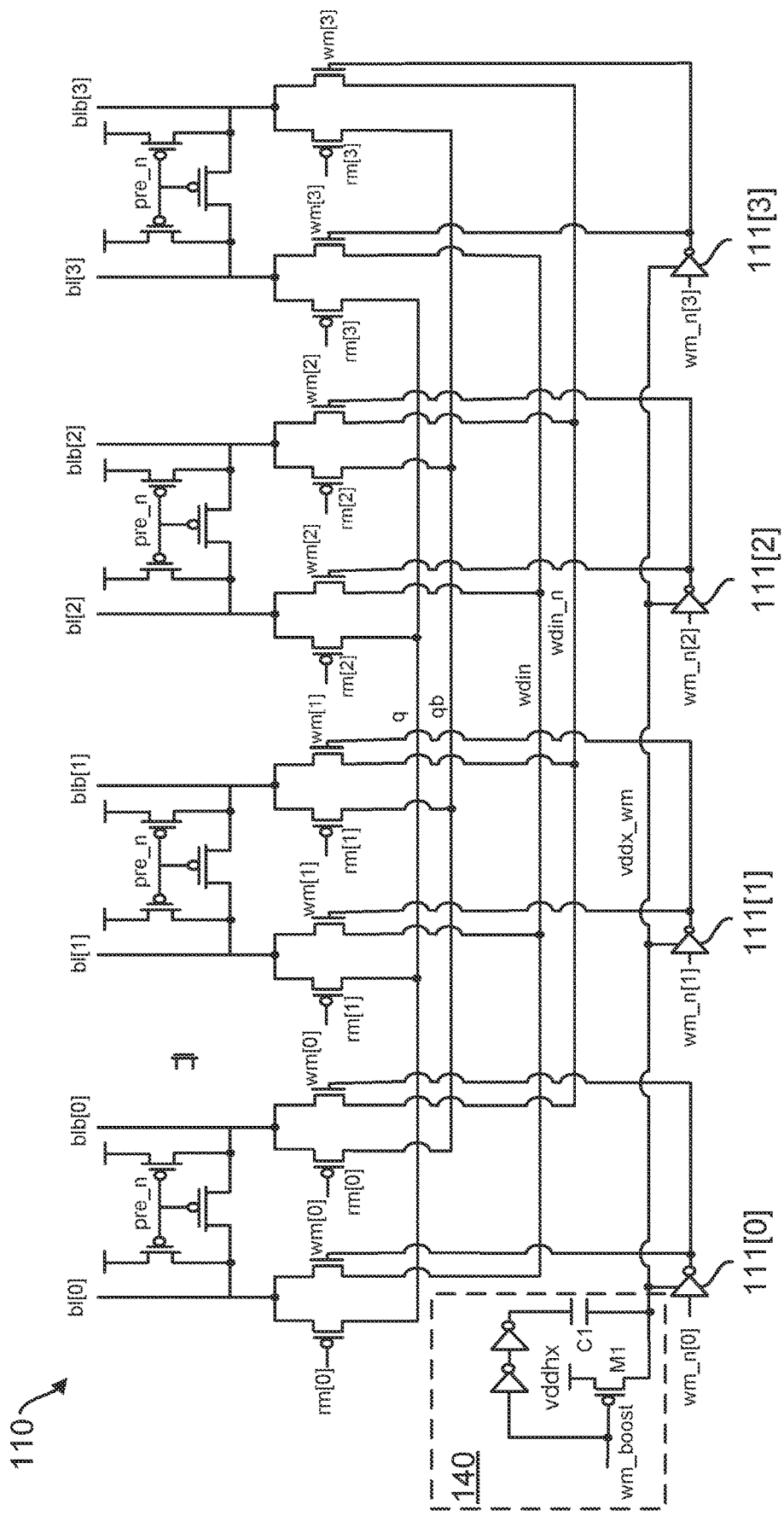
FIG. 3 illustrates a plurality of bit line columns coupled to a positive boosting circuit, according to one implementation.

FIG. 3 is an illustration of an example architecture for write multiplexer 110, according to one implementation. Write multiplexer 110 multiplexes between four different columns in this example, and each column includes a bit line pair. For instance, the column associated with column inverter 111[0] includes bl[0] and blb[0], where bl and blb represent complementary bit lines. Similarly, column inverter 111[1] is associated with the complementary bit lines having an index [1], column inverter 111[2] is associated with the complementary bit lines having an index [2], and column inverter 111[3] is associated with the complementary bit lines having an index [3]. A given column may be selected for writing by applying a digital 0 at its respective wm_n, which is inverted to a digital 1 at a voltage level determined by a voltage applied to the power nodes of the inverters 111.

Figure 4:
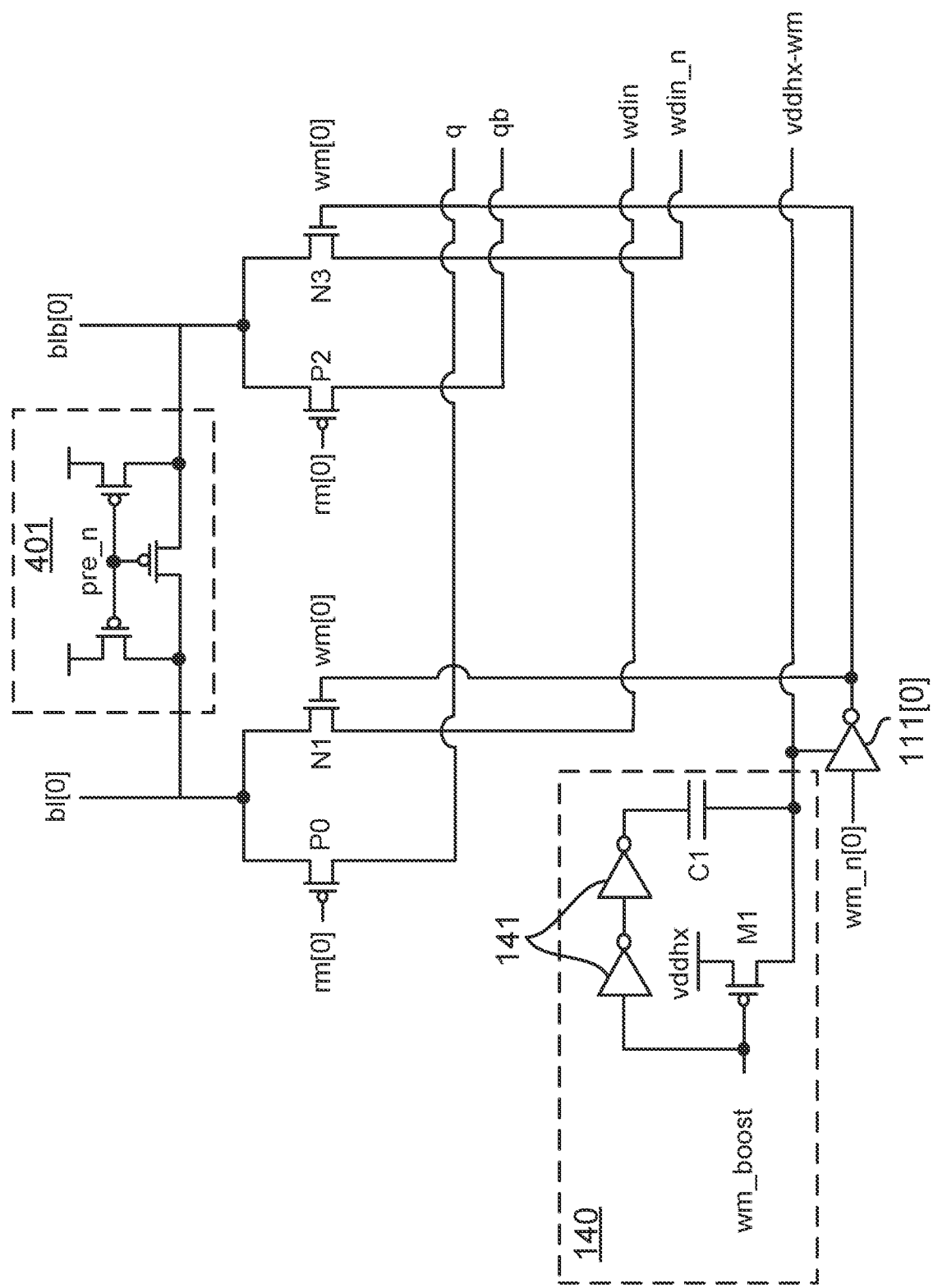
FIG. 4 illustrates an example column in the implementation of FIG. 3.

FIG. 4 is an illustration of the column from FIG. 3, the column having an index of [0]. It is understood that the other columns [1:3] operate in the same way in this example, so that the description of column [0] applies just as well to columns [1:3].

Before a write operation commences, both bit lines of the bit line pair are charged to VDD by pre-charging circuit 401. When the pre_n signal is a zero, it turns on the p-type metal oxide semiconductor (PMOS) transistors of pre-charging circuit 401, thereby causing the bit lines bl[0], blb[0] to be charged to VDD. The pre-charging signal pre_n may be turned off (go to a digital 1), thereby turning off the PMOS transistors of pre-charging circuit 401 and allowing the bit line pair to remain at the charged state. Furthermore, the various transistors P0, P2, N1, N3 are off.

During a write operation involving the column [0], one of the bit lines in the column is discharged and the other of the bit lines remains charged to affect writing either a 0 or 1 to an associated memory cell. Returning to the example above in which gdin_n is 1 and gdin is 0, wdin is 1 (VDD) and wdin_n is 0 (negatively boosted to 0V minus Δv1) by virtue of the write driver 130. Therefore, a high signal is applied to the source of NMOS transistor N1, and a low voltage is applied to the source of NMOS transistor N3.

As described above with respect to FIG. 1, the boost circuit 130 provides a positive boost so that the power node of column inverter 111[0] receives a voltage of vddhx plus a Δv2. This example assumes that the column with the index [0] is selected by the write multiplexing signal wm_n[0] being received as a digital zero. The output of the inverter 111[0] is at the voltage level vddhx plus Δv2, and it is applied to the control terminals (in this case, gates) of transistors N1 and N3. The extra boost increases the strength of the on state of the NMOS transistors N1 and N3. With the transistors N1 and N3 being in an on state, wdin_n is at a negatively boosted low-voltage, which discharges blb[0]. Similarly, wdin is at a high voltage, so that bl[0] remains charged.

The extra strength of the on states of the NMOS transistors N1 and N3 allows blb[0] to discharge more quickly than it would if transistor N3 had been charged only to vddhx. Also, the extra strength of the on state allows for charge transfer between wdin and bl[0], which further increases the voltage level difference between the two bit lines. Specifically, the threshold voltage of N1 may otherwise cause the bl[0] voltage to be VDD minus the threshold voltage. But a higher gate voltage at N1 allows charge transfer from wdin to bl[0], thereby raising the voltage of bl[0] over what it would have otherwise been. Together, these effects help to increase the write margin of the memory system 100 of FIG. 1.

The PMOS transistors P0 and P2 are associated with read operations and remain off during the example write operation. The example above provided an illustration in which wdin is 1 and wdin_n is 0, but when the complementary data value is written in another write operation, that would result in wdin being 0 and wdin_n being 1, which would discharge bl[0]. The effect of the strengthened on states provides improved write margin for that operation as well.

Figure 5:
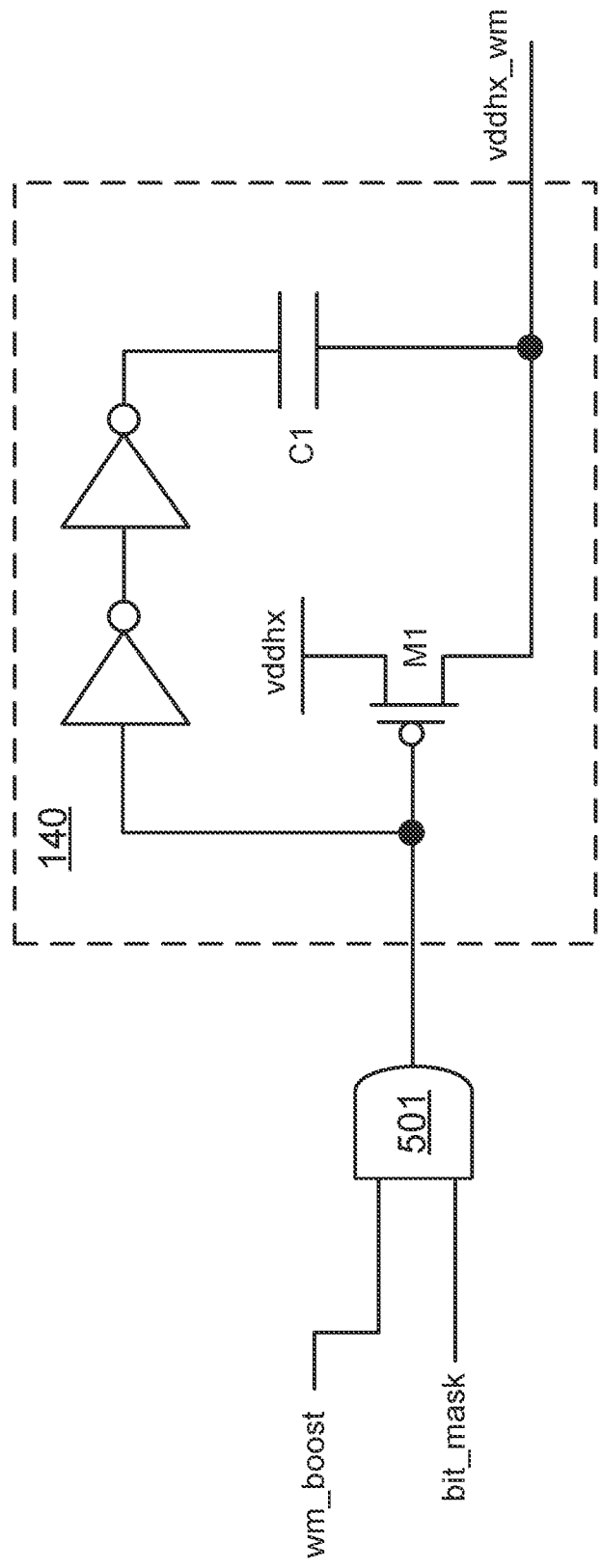
FIG. 5 illustrates an example boost gating, according to one implementation.

FIG. 5 is an illustration of example boost circuit 140, according to one implementation. In the example of FIG. 5, the boosting signal wm_boost may be gated so that it is not applied during a write masking operation. The boost circuit 140 in FIG. 5 is substantially the same as the one shown in FIG. 4. An AND gate 501 is added, which has a first input configured to receive wm_boost, and a second input configured to receive bit_mask, and an output coupled to the gate of M1 in boost circuit 140.

In this example, the write multiplexing signal is global, so even if some of the columns are disabled during a masking operation, the write multiplexing signal is still applied to those disabled columns. This may lead to a signal noise margin issue as well as a power consumption issue in some applications. Therefore, the implementation of FIG. 5 includes AND gate 501 to disable the boosting operation whenever the bit masking signal bit_mask is applied to cause a masking operation. In other words, the AND gate 501 has a digital 1 output in the event that a bit masking operation is ongoing. Such boost gating may prevent or reduce the signal noise margin issue and power consumption issue noted above.

Figure 6:
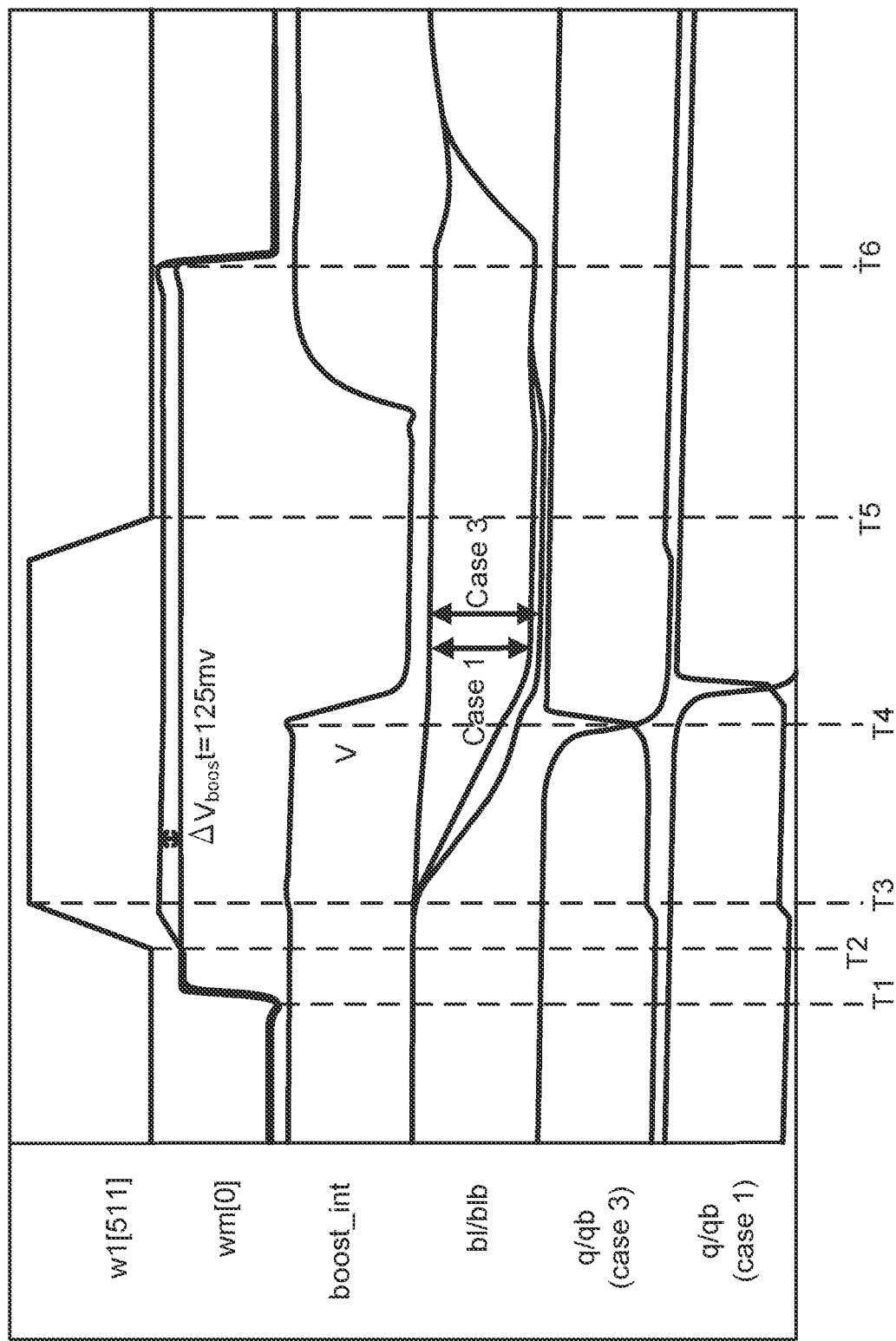
FIG. 6 illustrates an example timing diagram of the signals within the column of FIG. 4.

FIG. 6 is an illustration of a timeline for an example write operation performed by memory system 100, according to one implementation. FIG. 6 compares two different scenarios. A first scenario is referred to as "Case 1," and it assumes that the negative boost attributable to boosting circuit 150 is applied but that the positive boost attributable to boosting circuit 140 is not applied. The second scenario, "Case 3," assumes that both the negative boost and the positive boost are applied.

At time T1, the write operation begins by the write multiplexing signal wm[0] going hi to select the column associated with the index [0]. At time T2, the word line is asserted and the boosting begins on the write multiplexing signal wm (Case 3 only). At time T3, blb_begins to discharge, and about 125 mV of boost is achieved by the boosting circuit 140 (Case 3 only). The boosting increases the strength of the on state of the NMOS transistors, as explained in more detail above, thereby allowing blb to discharge more quickly. At time T4, negative boosting is applied as well, as the boost int signal goes low. The result is that blb discharges enough to create a voltage level difference of 596 mV in Case 1 and 677 mV in Case 3. Case 3 not only includes a quicker discharge for blb but also a larger voltage difference between the bit lines than is seen in Case 1.

At time T5, the word line is de-asserted. The write multiplexer signal wm[0] is de-asserted at time T6, and blb begins to return to its default charged state.

FIG. 7 is a table depicting noise margin in millivolts for three different cases, according to one implementation. The table of FIG. 7 was arrived at by simulations of one implementation of the architecture shown in FIG. 1. In FIG. 7, Case 1 and Case 3 are the same as those described above with respect to FIG. 6. Case 2 is an example case in which there is no positive boosting of the write multiplexer, but the negative boost at the write driver is increased above that of Case 1. In this example, the noise margin is simply a measure of how well the circuit operates within specified conditions, including that write operations are performed within a specified timeframe and are accurate.

The column for mean is simply a statistical mean, and the column for Sigma is a representation of standard deviation. A higher ratio of mean to Sigma is an indicator of better performance. As can be seen, Case 2 provides a better noise margin and a better mean to Sigma ratio than does Case 1, but at the cost of increased leakage of NMOS transistors in the write driver. Case 3 includes a better noise margin and mean to Sigma ratio than either of Cases 1 and 2 and without the leakage issue associated with Case 2. The increased noise margin and mean to Sigma ratio of Case 3 may be attributable to the faster discharge and larger voltage level difference between the bit lines, as illustrated above with respect to FIG. 6.

An example method for write operation will now be discussed with reference to the flowchart shown in FIG. 8. The method 800 may be performed by a memory system, such as illustrated in FIG. 1. In other words, the method 800 may be performed by a single- or multi-bank memory system having at least one write multiplexer to write bits of data to a memory bank.

At action 810, the method includes receiving a write multiplexing signal at a first column within a write multiplexer. An example is shown at FIG. 4, in which the write multiplexing signal wm_n is received at the column invertor 111. The write multiplexing signal may be received from a control circuit (such as an address decoder, not shown) or some other source.

At action 820, the method includes generating a boosted write multiplexing signal from the write multiplexing signal. An example is shown at FIG. 1, where boosting circuit 140 applies positive boost to a power node of the column invertor 111. The power node of the column invertor 111 determines the voltage of the inverted output signal, which corresponds to the boosted write multiplexing signal.

Action 820 may include charging a capacitor, including toggling transistor M1 so that the top of capacitor C1 is discharged and then charged in the boosting circuit 140. The capacitive coupling boosts the voltage at the drain of transistor M1 and the power node of the column invertor 111. The write multiplexing signal is inverted by the inverter to create the boosted write multiplexing signal.

Figure 8:
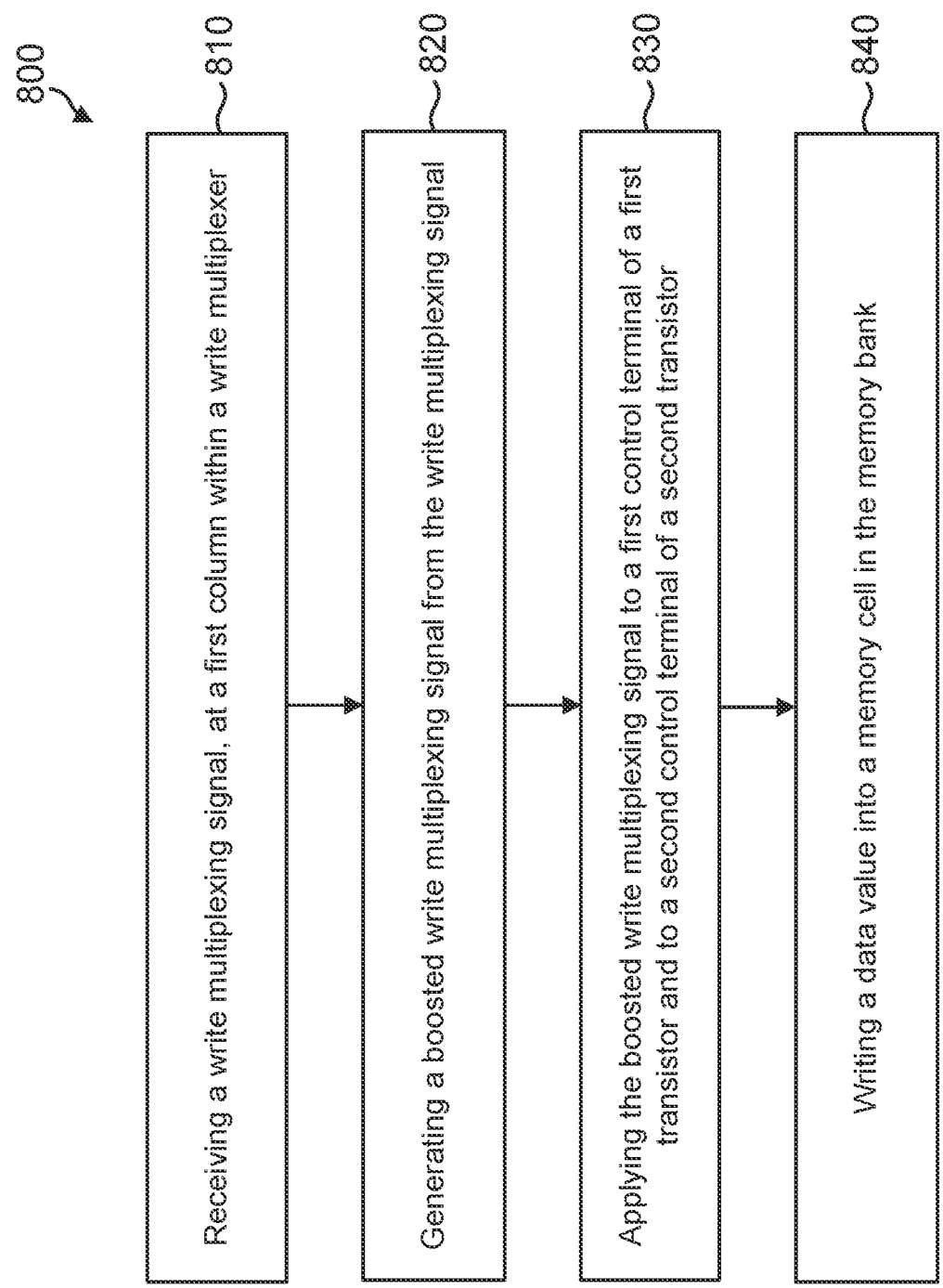
FIG. 8 illustrates a flowchart of an example method that may be performed by the memory of FIG. 1.

Although not shown in FIG. 8, the method 800 may also include generating a negative boost at a write driver output. An example is shown in FIG. 1, in which negative boost is applied to either one of wdin, wdin_n, depending on the value to be written to memory. The negative boosting may include toggling transistor M0 to negatively charge and then discharge the negative charge of capacitor C0 on to one of the write driver outputs wdin, wdin_n, depending on the value of the bit to be written.

At action 830, the method includes applying the boosted write multiplexing signal to a first control terminal of a first transistor (e.g., the gate of transistor N1 of FIG. 4) and to a second control terminal of a second transistor (e.g., the gate of transistor N3 of FIG. 4). In this example, the transistor N1 couples a first write driver output wdin to the bit line bl[0], and the transistor N3 couples a second write driver output wdin_n to the complementary bit line blb[0]. The result is that one of the bit lines is discharged and the other of the bit lines remains charged so that there is a voltage differential across the bit line pair. The voltage differential may cause a data value to be stored in a memory cell in the memory bank, as in action 840. The data value is defined by the first write driver output and the second write driver output, which themselves are defined by a data input (e.g., gdin, gdin_n of FIG. 1).

As noted above, the method may be performed in a memory system that has multiple memory banks, each of the memory banks coupled to a write multiplexer, where each write multiplexer is coupled to a positive boosting circuit and to both write driver outputs. In some examples, only one memory bank may be accessed during a read or write operation. Therefore, a subsequent write operation may be performed on the same memory bank or a different memory bank. In some implementations, each multiplexer may include its own boosting circuit, in which case boosting circuit 140 may be replicated for each one of the multiplexers 110, 120. Furthermore, various implementations may use only a single memory bank or more than two memory banks.

The scope of implementations is not limited to the series of actions described with respect to FIG. 8. Rather, other implementations may add, omit, rearrange, or modify one or more of the actions. For instance, during operation of the memory system, a write operation may be performed on the first memory bank or on the second memory bank and the subsequent write operation may then be performed on either the first memory bank or the second memory bank, and on and on. The write operations may or may not be interspersed with read operations, and the operations may repeat as appropriate.

Figure 9:
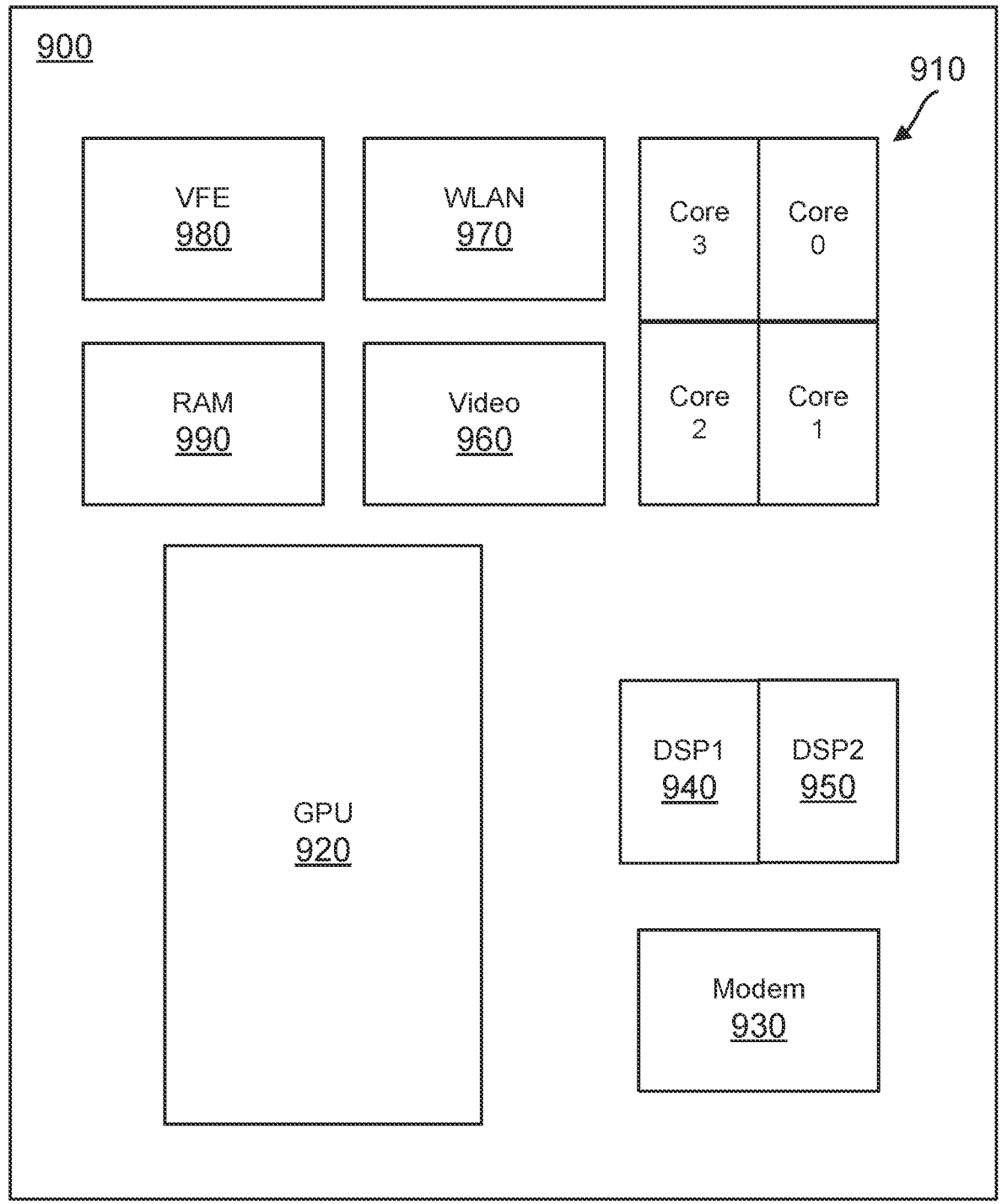
FIG. 9 illustrates an example system on chip (SOC) that may incorporate a memory according to an aspect of the disclosure.

FIG. 9 is an illustration of example SOC 900, according to one implementation. In this example, SOC 900 is implemented on a semiconductor die, and it includes multiple system components 910-990. Specifically, in this example, SOC 900 includes CPU 910 that is a multi-core general-purpose processor having four processor cores, core 0-core 3. Of course, the scope of implementations is not limited to any particular number of cores, as other implementations may include two cores, eight cores, or any other appropriate number of cores in the CPU 910. SOC 900 further includes other system components, such as a first digital signal processor (DSP) 940, a second DSP 950, a modem 930, GPU 920, a video subsystem 960, a wireless local area network (WLAN) transceiver 970, and a video-front-end (VFE) subsystem 980. SOC 900 also includes RAM memory unit 990, which may operate as system RAM for any of the components 910-980. For instance, RAM memory unit 990 may receive data and instructions from any of the components 910-980.

RAM memory unit 990 may include boost circuits, such as those described above with respect to FIGS. 1-7. Furthermore, RAM memory unit 990 may perform the actions of FIG. 8 to perform write operations.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

Implementation examples are described in the following numbered clauses:

1. A circuit comprising:
   a first bit line coupled to a first write driver output by a first n-type metal oxide semiconductor (NMOS) transistor;
   a first complementary bit line coupled to a second write driver output by a second NMOS transistor;
   a first inverter having an output coupled to a first gate of the first NMOS transistor and a second gate of the second NMOS transistor; and
   a first boost circuit coupled to a power node of the first inverter, the first boost circuit including a first transistor coupling a power supply to the power node of the first inverter and also including a first capacitor coupled to the power node of the first inverter and to the first transistor.
2. The circuit of clause 1, wherein the first transistor comprises a p-type metal oxide semiconductor (PMOS) transistor, wherein the first capacitor is coupled to a gate of the first transistor through a plurality of additional inverters.
3. The circuit of clauses 1, wherein the first transistor comprises a p-type metal oxide semiconductor (PMOS) transistor, and wherein a gate of the first transistor is coupled to a second inverter and a third inverter, the third inverter being coupled to a drain of the first transistor, wherein the drain of the first transistor is coupled to the first capacitor and to the power node of the first inverter.
4. The circuit of clauses 1-3, further comprising:
   a second bit line coupled to the first write driver output by a third NMOS transistor;
   a second complementary bit line coupled to the second write driver output by a fourth NMOS transistor; and
   a second inverter having an output coupled to a third gate of the third NMOS transistor and a fourth gate of the fourth NMOS transistor;
   wherein the first boost circuit is coupled to a power node of the second inverter, wherein the first inverter and the second inverter are controlled by write multiplexer signals.
5. The circuit of clauses 1-4, further comprising:
   a second boost circuit coupled to a write driver circuit providing the first write driver output and the second write driver output, wherein the second boost circuit includes a second capacitor coupled to an input of the write driver circuit and to a second transistor coupled to ground.
6. The circuit of clause 5, wherein a gate of the second transistor is coupled to a second inverter and a third inverter, the third inverter being coupled to a drain of the second transistor, wherein the drain of the second transistor is coupled to the second capacitor and to an input of the write driver circuit.
7. The circuit of clauses 1-6 further comprising: a logic gate receiving a bit masking signal and a boost signal, wherein the logic gate is coupled to a gate of the first transistor.
8. The circuit of clause 7, wherein the logic gate comprises an AND gate.
9. A memory comprising:
   a first multiplexer coupling a first plurality of bit lines to a write driver;
   a second multiplexer coupling a second plurality of bit lines to the write driver; and
   a first boost circuit coupled to a first plurality of column inverters associated with the first multiplexer and coupled to a second plurality of column inverters associated with the second multiplexer;
   the first boost circuit including a first transistor coupling a power supply to power nodes of the first plurality of column inverters and of the second plurality of column inverters, the first boost circuit further including a first capacitor coupled to the power nodes and to the first transistor.
10. The memory of clause 9, wherein the first multiplexer corresponds to a first memory bank, and wherein the second multiplexer corresponds to a second memory bank, the first memory bank and the second memory bank being included in a multi-bank memory system.
11. The memory of clauses 9-10, wherein the first transistor comprises a p-type metal oxide semiconductor (PMOS) transistor, wherein the first capacitor is coupled to a gate of the first transistor through a plurality of additional inverters.
12. The memory of clauses 9-10, wherein the first transistor comprises a p-type metal oxide semiconductor (PMOS) transistor, and wherein a gate of the first transistor is coupled to a plurality of series inverters, the plurality of series inverters being coupled to a drain of the first transistor, wherein the drain of the first transistor is coupled to the first capacitor and to the power nodes of the first plurality of column inverters and of the second plurality of column inverters.
13. The memory of clauses 9-12, further comprising:
   a second boost circuit coupled to the write driver and configured to provide a write driver output and a complementary write driver output to the first multiplexer and to the second multiplexer, wherein the second boost circuit includes a second capacitor coupled to an input of the write driver and to a second transistor coupled to ground.
14. The memory of clause 13, wherein a gate of the second transistor is coupled to a plurality of series inverters, the plurality of series inverters being coupled to a drain of the second transistor, wherein the drain of the second transistor is coupled to the second capacitor and to an input of the write driver.
15. The memory of clauses 9-14, further comprising: a logic gate receiving a bit masking signal and a boost signal, wherein the logic gate is coupled to a gate of the first transistor.
16. The memory of clause 15, wherein the logic gate comprises an AND gate.
17. A method for performing a write operation in a memory system, the method comprising:
   receiving a write multiplexing signal at a first column within a write multiplexer, wherein the first column includes a bit line and a complementary bit line in communication with a memory bank;
generating a boosted write multiplexing signal from the write multiplexing signal;
applying the boosted write multiplexing signal to a first control terminal of a first transistor and to a second control terminal of a second transistor, wherein the first transistor couples a first write driver output to the bit line and the second transistor couples a second write driver output to the complementary bit line; and
writing a data value into a memory cell in the memory bank, wherein the data value is defined by the first write driver output and the second write driver output.

18. The method of clause 17, wherein generating the boosted write multiplexing signal comprises:
discharging a capacitor, including toggling a third transistor that is coupled to the capacitor, wherein a terminal of the capacitor is coupled to a power node of an inverter;
charging the capacitor at a drain of the third transistor and the power node of the inverter; and
inverting the write multiplexing signal using the inverter.

19. The method of clauses 17-18, further comprising:
negatively boosting the first write driver output.

20. The method of clause 19, wherein negatively boosting the first write driver output comprises:
toggling a third transistor that couples an additional capacitor to ground; and
capacitively coupling a negative charge of the additional capacitor onto the first write driver output.

21. A circuit comprising:
a plurality of columns, each one of the columns including a bit line and a complementary bit line in communication with a respective memory bit cell;
means for multiplexing signals from a write driver to the plurality of columns, the multiplexing means including a plurality of transistors coupling respective bit lines and respective complementary bit lines to the write driver; and
means for positively boosting a voltage applied to gates of the plurality of transistors of the multiplexing means.

22. The circuit of clause 21, wherein the plurality of transistors includes a plurality of n-type metal oxide semiconductor (NMOS) transistors, and wherein gates of the plurality of transistors are coupled to respective column inverters, the respective column inverters receiving the voltage.

23. The circuit of clauses 21-22, further comprising:
means for negatively boosting the signals from the write driver.

24. The circuit of clause 23, wherein the means for negatively boosting the signals from the write driver comprises:
a capacitor coupled to an input of the write driver and to a p-type metal oxide semiconductor (PMOS) transistor coupled to ground, wherein a gate of the PMOS transistor is coupled to a plurality of series inverters, the plurality of series inverters being coupled to a drain of the PMOS transistor, wherein the drain of the PMOS transistor is coupled to the capacitor and to an input of the write driver.

25. The circuit of clause 21, wherein the means for positively boosting the voltage comprises:
a capacitor coupled to power nodes of column inverters associated with the plurality of columns and to a p-type metal oxide semiconductor (PMOS) transistor coupled to a power supply, wherein a gate of the PMOS transistor is coupled to a plurality of series inverters, the plurality of series inverters being coupled to a drain of the PMOS transistor, wherein the drain of the PMOS transistor is coupled to the capacitor and to the power nodes of the column inverters.

What is claimed is:

1. A circuit comprising:
a first bit line coupled to a first write driver output by a first n-type metal oxide semiconductor (NMOS) transistor;
a first complementary bit line coupled to a second write driver output by a second NMOS transistor;
a first inverter having an output coupled to a first gate of the first NMOS transistor and a second gate of the second NMOS transistor; and
a first boost circuit coupled to a power node of the first inverter, the first boost circuit including a first transistor coupling a power supply to the power node of the first inverter and also including a first capacitor coupled to the power node of the first inverter and to the first transistor.

2. The circuit of claim 1, wherein the first transistor comprises a p-type metal oxide semiconductor (PMOS) transistor, wherein the first capacitor is coupled to a gate of the first transistor through a plurality of additional inverters.

3. The circuit of claim 1, wherein the first transistor comprises a p-type metal oxide semiconductor (PMOS) transistor, and wherein a gate of the first transistor is coupled to a second inverter and a third inverter, the third inverter being coupled to a drain of the first transistor through the first capacitor, wherein the drain of the first transistor is coupled to the first capacitor and to the power node of the first inverter.

4. The circuit of claim 1, further comprising:
a second bit line coupled to the first write driver output by a third NMOS transistor;
a second complementary bit line coupled to the second write driver output by a fourth NMOS transistor; and
a second inverter having an output coupled to a third gate of the third NMOS transistor and a fourth gate of the fourth NMOS transistor;
wherein the first boost circuit is coupled to a power node of the second inverter, wherein the first inverter and the second inverter are controlled by write multiplexer signals.

5. The circuit of claim 1, further comprising:
a second boost circuit coupled to a write driver circuit providing the first write driver output and the second write driver output, wherein the second boost circuit includes a second capacitor coupled to an input of the write driver circuit and to a second transistor coupled to ground.

6. The circuit of claim 5, wherein a gate of the second transistor is coupled to a second inverter and a third inverter, the third inverter being coupled to a drain of the second transistor, wherein the drain of the second transistor is coupled to the second capacitor and to an input of the write driver circuit.

7. The circuit of claim 1 further comprising: a logic gate receiving a bit masking signal and a boost signal, wherein the logic gate is coupled to a gate of the first transistor.

8. The circuit of claim 7, wherein the logic gate comprises an AND gate.

9. A memory comprising:
a first multiplexer coupling a first plurality of bit lines to a write driver;

a second multiplexer coupling a second plurality of bit lines to the write driver; and
a first boost circuit coupled to a first plurality of column inverters associated with the first multiplexer and coupled to a second plurality of column inverters associated with the second multiplexer;
the first boost circuit including a first transistor coupling a power supply to power nodes of the first plurality of column inverters and of the second plurality of column inverters, the first boost circuit further including a first capacitor coupled to the power nodes and to the first transistor.

10. The memory of claim 9, wherein the first multiplexer corresponds to a first memory bank, and wherein the second multiplexer corresponds to a second memory bank, the first memory bank and the second memory bank being included in a multi-bank memory system.

11. The memory of claim 9, wherein the first transistor comprises a p-type metal oxide semiconductor (PMOS) transistor, wherein the first capacitor is coupled to a gate of the first transistor through a plurality of additional inverters.

12. The memory of claim 9, wherein the first transistor comprises a p-type metal oxide semiconductor (PMOS) transistor, and wherein a gate of the first transistor is coupled to a plurality of series inverters, the plurality of series inverters being coupled to a drain of the first transistor, wherein the drain of the first transistor is coupled to the first capacitor and to the power nodes of the first plurality of column inverters and of the second plurality of column inverters.

13. The memory of claim 9, further comprising:
a second boost circuit coupled to the write driver and configured to provide a write driver output and a complementary write driver output to the first multiplexer and to the second multiplexer, wherein the second boost circuit includes a second capacitor coupled to an input of the write driver and to a second transistor coupled to ground.

14. The memory of claim 13, wherein a gate of the second transistor is coupled to a plurality of series inverters, the plurality of series inverters being coupled to a drain of the second transistor, wherein the drain of the second transistor is coupled to the second capacitor and to an input of the write driver.

15. The memory of claim 9, further comprising: a logic gate receiving a bit masking signal and a boost signal, wherein the logic gate is coupled to a gate of the first transistor.

16. The memory of claim 15, wherein the logic gate comprises an AND gate.

17. A method for performing a write operation in a memory system, the method comprising:
receiving a write multiplexing signal at a first column within a write multiplexer, wherein the first column includes a bit line and a complementary bit line in communication with a memory bank;
generating a boosted write multiplexing signal from the write multiplexing signal;
applying the boosted write multiplexing signal to a first control terminal of a first transistor and to a second control terminal of a second transistor, wherein the first transistor couples a first write driver output to the bit line and the second transistor couples a second write driver output to the complementary bit line; and
writing a data value into a memory cell in the memory bank, wherein the data value is defined by the first write driver output and the second write driver output.

18. The method of claim 17, wherein generating the boosted write multiplexing signal comprises:
discharging a capacitor, including toggling a third transistor that is coupled to the capacitor, wherein a terminal of the capacitor is coupled to a power node of an inverter;
charging the capacitor at a drain of the third transistor and the power node of the inverter; and
inverting the write multiplexing signal using the inverter.

19. The method of claim 17, further comprising:
negatively boosting the first write driver output.

20. The method of claim 19, wherein negatively boosting the first write driver output comprises:
toggling a third transistor that couples an additional capacitor to ground; and
capacitively coupling a negative charge of the additional capacitor onto the first write driver output.

21. A circuit comprising:
a plurality of columns, each one of the columns including a bit line and a complementary bit line in communication with a respective memory bit cell;
means for multiplexing signals from a write driver to the plurality of columns, the multiplexing means including a plurality of transistors coupling respective bit lines and respective complementary bit lines to the write driver; and
means for positively boosting a voltage applied to gates of the plurality of transistors of the multiplexing means.

22. The circuit of claim 21, wherein the plurality of transistors includes a plurality of n-type metal oxide semiconductor (NMOS) transistors, and wherein gates of the plurality of transistors are coupled to respective column inverters, the respective column inverters receiving the voltage.

23. The circuit of claim 21, further comprising:
means for negatively boosting the signals from the write driver.

24. The circuit of claim 23, wherein the means for negatively boosting the signals from the write driver comprises:
a capacitor coupled to an input of the write driver and to a n-type metal oxide semiconductor (NMOS) transistor coupled to ground, wherein a gate of the NMOS transistor is coupled to a plurality of series inverters, the plurality of series inverters being coupled to a drain of the NMOS transistor, wherein the drain of the NMOS transistor is coupled to the capacitor and to an input of the write driver.

25. The circuit of claim 21, wherein the means for positively boosting the voltage comprises:
a capacitor coupled to power nodes of column inverters associated with the plurality of columns and to a p-type metal oxide semiconductor (PMOS) transistor coupled to a power supply, wherein a gate of the PMOS transistor is coupled to a plurality of series inverters, the plurality of series inverters being coupled to a drain of the PMOS transistor, wherein the drain of the PMOS transistor is coupled to the capacitor and to the power nodes of the column inverters.

* * * * *